United States Patent
Yoshizawa et al.

(10) Patent No.: US 10,236,248 B2
(45) Date of Patent: Mar. 19, 2019

(54) SEMICONDUCTOR DEVICE AND MANUFACTURING METHOD THEREOF

(71) Applicant: SEIKO EPSON CORPORATION, Tokyo (JP)

(72) Inventors: Takahiko Yoshizawa, Sakata (JP); Kunio Watanabe, Sakata (JP); Tatsuki Shirasawa, Sakata (JP); Takashi Sakuda, Kai (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/603,984

(22) Filed: May 24, 2017

(65) Prior Publication Data

US 2017/0365549 A1    Dec. 21, 2017

(30) Foreign Application Priority Data

Jun. 16, 2016    (JP) .................................. 2016-119828

(51) Int. Cl.
| | |
|---|---|
| *H01L 23/522* | (2006.01) |
| *H01L 21/768* | (2006.01) |
| *H01L 23/532* | (2006.01) |
| *H01L 23/00* | (2006.01) |
| *H01L 23/485* | (2006.01) |

(52) U.S. Cl.
CPC .... *H01L 23/5226* (2013.01); *H01L 21/76802* (2013.01); *H01L 21/76877* (2013.01); *H01L 23/485* (2013.01); *H01L 24/03* (2013.01); *H01L 24/05* (2013.01); *H01L 24/06* (2013.01); *H01L 24/85* (2013.01); *H01L 23/5329* (2013.01); *H01L 23/53214* (2013.01); *H01L 23/53257* (2013.01); *H01L 2224/05553* (2013.01); *H01L 2224/0612* (2013.01); *H01L 2224/48463* (2013.01)

(58) Field of Classification Search
CPC .......... H01L 23/5226; H01L 23/53214; H01L 23/5329
See application file for complete search history.

(56) References Cited

U.S. PATENT DOCUMENTS 7,211,902 B2 * 5/2007 Yamaha .................. H01L 24/03
257/780
2002/0155719 A1    10/2002 Okada
(Continued)

FOREIGN PATENT DOCUMENTS

| JP | H07-94639 A | 4/1995 |
|---|---|---|
| JP | 2002-324797 A | 11/2002 |

*Primary Examiner* — Peniel M Gumedzoe
(74) *Attorney, Agent, or Firm* — Oliff PLC

(57) ABSTRACT

The manufacturing method of a semiconductor device can improve the mechanical strength of a pad more than before, and suppress the occurrence of a crack. The manufacturing method of a semiconductor device includes: forming a first pad constituted by a first metal layer; forming an insulating layer on the first pad; providing an opening portion in the insulating layer by removing the insulating layer on at least a partial region of the first pad; forming a second pad constituted by a second metal layer in the opening portion of the insulating layer so as to have a film thickness that is smaller than the film thickness of the insulating layer; and forming a third pad constituted by a third metal layer on the second pad.

15 Claims, 4 Drawing Sheets

(56) References Cited

U.S. PATENT DOCUMENTS

| | | | | |
|---|---|---|---|---|
| 2003/0102475 A1* | 6/2003 | Kwon | ............... | H01L 24/03 |
| | | | | 257/48 |
| 2006/0091536 A1* | 5/2006 | Huang | ............... | H01L 24/05 |
| | | | | 257/734 |
| 2007/0182001 A1* | 8/2007 | Kanzaki | ............... | H01L 24/03 |
| | | | | 257/734 |
| 2008/0237853 A1* | 10/2008 | Amatatsu | ............... | H01L 23/293 |
| | | | | 257/737 |
| 2009/0184424 A1* | 7/2009 | Furusawa | ............... | H01L 22/32 |
| | | | | 257/758 |
| 2014/0042633 A1* | 2/2014 | Hong | ............... | H01L 24/03 |
| | | | | 257/773 |

\* cited by examiner

SEMICONDUCTOR DEVICE AND MANUFACTURING METHOD THEREOF

BACKGROUND

1. Technical Field

The present invention relates to semiconductor devices, manufacturing methods thereof, and the like.

2. Related Art

Aluminum (Al) or an aluminum alloy, in general, is used as a material for metal interconnects that are formed in a semiconductor chip that constitutes a semiconductor device. In the semiconductor chip, partial regions of the metal interconnects constitute pads (terminals) that are electrically connected to an external member for power supply and signal transmission. For example, in the case of a semiconductor chip that has a multilevel interconnection structure, partial regions of the metal interconnects in the uppermost level that are formed on an interlayer insulating film constitute pads.

Furthermore, pads of the semiconductor chip are electrically connected to terminals or electrodes of a semiconductor package, a printed circuit board, or the like, by wire bonding. Heretofore, a gold (Au) wire has been used in wire bonding, but in recent years, a copper (Cu) wire is used as well. However, the copper wire has higher hardness compared with a gold wire and an aluminum pad, and there are cases where a pad does not have a strength that is sufficient to endure mechanical stress that is applied when the wire is bonded thereto, and therefore, a crack occurs in the pad or an interlayer insulating film.

As a related technology, protecting a bonding pad of a semiconductor device from corrosion due to moisture or the like is disclosed in JP-A-7-94639. The semiconductor device includes a metal interconnect pattern including a bonding pad provided on a semiconductor substrate via an insulating film, an insulating protective film that covers the metal interconnect pattern, and a bonding wire that is joined to the bonding pad. The insulating protective film is constituted by an organic resin film, and covers an exposed surface of the bonding pad excluding the portion to which the bonding wire is to be joined.

However, in JP-A-7-94639 as well, the metal interconnect pattern including the bonding pad provided on the semiconductor substrate via the insulating film is constituted by a single layer. Accordingly, particularly in the case of using a copper bonding wire, a crack may occur in the bonding pad or the insulating film when the bonding wire is joined to the bonding pad.

SUMMARY

Some aspects of the invention relate to providing a semiconductor device that can improve the mechanical strength of a pad more than before, and suppress the occurrence of a crack, and a manufacturing method thereof. Also, some other aspects of the invention relate to manufacturing such a semiconductor device without adding new processes to a common manufacturing method of a semiconductor device.

A manufacturing method of a semiconductor device according to a first aspect of the invention includes: (a) forming a first pad constituted by a first metal layer; (b) forming an insulating layer on the first pad; (c) providing an opening portion in the insulating layer by removing the insulating layer on at least a partial region of the first pad; (d) forming a second pad constituted by a second metal layer in the opening portion of the insulating layer so as to have a film thickness that is smaller than the film thickness of the insulating layer; and (e) forming a third pad constituted by a third metal layer on the second pad.

According to the first aspect of the invention, a pad having a multilayer structure can be configured by a plurality of metal plates including the first to third pads, and as a result, the mechanical strength of a pad can be improved more than before, and the occurrence of a crack can be suppressed. Also, the second pad is formed so as to have a film thickness that is smaller than the film thickness of the insulating layer, and therefore, the second pad need not be thinned through polishing. Furthermore, as a result of forming the first and second pads at the same time a metal interconnect or a plug is formed, such a semiconductor device can be manufactured without adding new processes to a common manufacturing method of a semiconductor device.

Here, the step (c) may include providing a through hole having an opening diameter that is smaller than the opening diameter of the opening portion, in the insulating layer, and the step (d) may include forming the second metal layer in the through hole in the insulating layer so as to have a film thickness that is larger than the film thickness of the insulating layer. Accordingly, at the same time the plug is formed by filling the through hole with a sufficient amount of metal, the second pad can be formed in the opening portion.

In this case, the step (d) may further include removing the second metal layer formed on the insulating layer. Accordingly, the upper surface of the insulating layer can be planarized such that the plug does not protrude from the through hole.

The manufacturing method of a semiconductor device according to the first aspect of the invention may further include (f) bonding one end of a copper (Cu) wire to the third pad. Accordingly, the pad of the semiconductor chip can be electrically connected to a terminal or an electrode of a semiconductor package, a printed circuit board, or the like.

A semiconductor device according to a second aspect of the invention includes: a first pad constituted by a first metal layer; an insulating layer that is arranged on the first pad, and includes an opening portion; a second pad that is arranged in the opening portion of the insulating layer, has a film thickness that is smaller than the film thickness of the insulating layer, and is constituted by a second metal layer; and a third pad that is arranged on the second pad, and is constituted by a third metal layer.

According to the second aspect of the invention, a pad having a multilayer structure can be configured by a plurality of metal plates including the first to third pads, and as a result, the mechanical strength of the pad can be improved more than before, and the occurrence of a crack can be suppressed.

Here, in the case where the semiconductor device further includes a protective film that covers a peripheral portion of the third pad in plan view, the second pad desirably has a uniform film thickness under a region, of the third pad, that is not covered by the protective film. Accordingly, the concentration of stress on the central portion of the second pad that occurs when the central portion is thinner than the peripheral portion is mitigated, and the occurrence of a crack in the pad can be suppressed.

Furthermore, the second pad may have a box shape that is constituted by a bottom portion that is arranged along the first pad and four side walls that are arranged along four side surfaces of the opening portion of the insulating layer. The film thickness of the bottom portion of the second pad is smaller than the film thickness of the insulating layer, and therefore, the resistance value of the second pad between the first pad and the third pad can be reduced, and the manufacturing cost of the second pad can be reduced.

Also, the insulating layer may further include a through hole having an opening diameter that is smaller than the opening diameter of the opening portion, and the semiconductor device may further include a plug that is arranged in the through hole in the insulating layer, and is electrically connected to the first and third pads. Accordingly, the electrical connection between the first pad and the third pad can be enhanced.

In that described above, the first pad may have a film thickness of 1.5 μm or less. In the case of using a pad having a multilayer structure, even if the film thickness of each layer of the pad is reduced in order to achieve high integration of the semiconductor device, the mechanical strength of the pad can be improved, and the occurrence of a crack can be suppressed.

Furthermore, the second pad may have a Young's modulus that is larger than the Young's modulus of each of the first and third pads. For example, the first and third pads may each include aluminum (Al), and the second pad may include tungsten (W). Accordingly, a force applied to a partial region of the third pad is applied to an interlayer insulating film via the first pad after being distributed along the principal surface of the second pad, and as a result, the occurrence of a crack in the interlayer insulating film can be suppressed.

Also, the first pad may be arranged on an interlayer insulating film that includes FSG (fluorine-doped silicate glass) or a low-k material. By using such an interlayer insulating film, although the parasitic capacitance of the pad can be reduced, the mechanical strength of the interlayer insulating film decreases. However, in the case of using the pad having a multilayer structure, even if the mechanical strength of the interlayer insulating film is low, the mechanical strength of the pad can be improved, and the occurrence of a crack can be suppressed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
FIG. 1 is a cross-sectional view, at a first step, of a semiconductor device according to one embodiment of the invention.

Hereinafter, an embodiment of the invention will be described in detail with reference to the drawings. The same constituent elements are given the same reference numerals, and redundant descriptions are omitted.

Manufacturing Method of Semiconductor Device

FIGS. 1 to 15 are cross-sectional views, in a manufacturing process, of a semiconductor device according to one embodiment of the invention. In the following, a case where a semiconductor device including an N-channel MOS transistor is manufactured using a P-type semiconductor substrate will be described as an example.

In a first step, as shown in FIG. 1, a gate electrode 11 is formed on a semiconductor substrate 10 via a gate insulating film, the gate electrode 11 being patterned using a photolithography method. For example, the semiconductor substrate 10 is made of silicon (Si) including P-type impurities such as boron (B) ions or the like. The gate insulating film is made of silicon oxide ($SiO_2$) or the like, and the gate electrode 11 is made of polysilicon doped with impurities so as to be conductive, or the like.

Also, N-type impurities such as antimony (Sb) ions or phosphorus (P) ions are implanted to regions of the semiconductor substrate 10 on both sides of the gate electrode 11 using a mask formed using a photolithography method. Accordingly, N-type impurity regions 12 and 13, which are a source and a drain of an N-channel MOS transistor, are formed.

Furthermore, P-type impurities such as boron (B) ions are implanted to a predetermined region of the semiconductor substrate 10 using a mask formed using a photolithography method. Accordingly, a P-type impurity region 14, which is a contact region of the semiconductor substrate 10, is formed. Also, as shown in FIG. 1, side wall insulating films 15 and 16 may be formed on side surfaces of the gate insulating film and the gate electrode 11.

Figure 2:
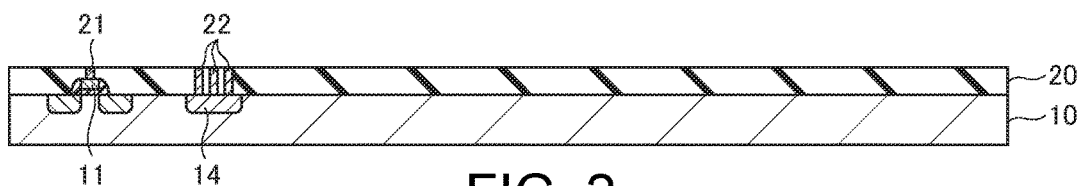
FIG. 2 is a cross-sectional view, at a second step, of the semiconductor device according to one embodiment of the invention.

In a second step, as shown in FIG. 2, an interlayer insulating film 20 is formed on the semiconductor substrate 10 in which the gate electrode 11 and the like are provided. The interlayer insulating film 20 and interlayer insulating films 40 and 60, which will be described later, may be made of silicon oxide ($SiO_2$), BPSG (Boron Phosphorus Silicon Glass), or the like, for example. Furthermore, a photoresist is provided on the interlayer insulating film 20 using a photolithography method, the interlayer insulating film 20 is etched using the photoresist as a mask, and thereby a through hole and contact holes are provided in the interlayer insulating film 20.

The through hole and the contact holes in the interlayer insulating film 20 are filled with metal such as tungsten (W), and thereby plugs 21 and 22 are formed. Note that, when the plugs are formed, a barrier metal such as titanium (Ti) or titanium nitride (TiN) may be arranged around the metal that is tungsten (W) or the like. Thereafter, an upper surface of the interlayer insulating film 20 is polished by CMP (Chemical Mechanical Polishing) or the like, and thereby an excess metal film formed on the upper surface of the interlayer insulating film 20 is removed.

The through hole in the interlayer insulating film 20 reaches the gate electrode 11, and the plug 21 formed in the through hole is electrically connected to the gate electrode 11. The contact holes in the interlayer insulating film 20 reach the contact region 14 of the semiconductor substrate 10, and the plugs 22 formed in the contact holes are electrically connected to the contact region 14.

Figure 3:
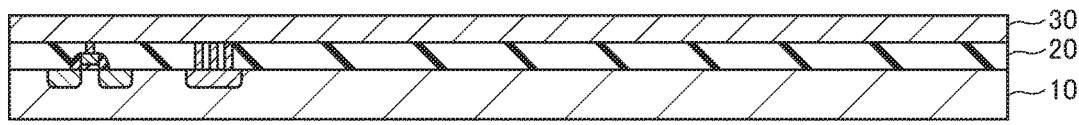
FIG. 3 is a cross-sectional view, at a third step, of the semiconductor device according to one embodiment of the invention.
Figure 4:
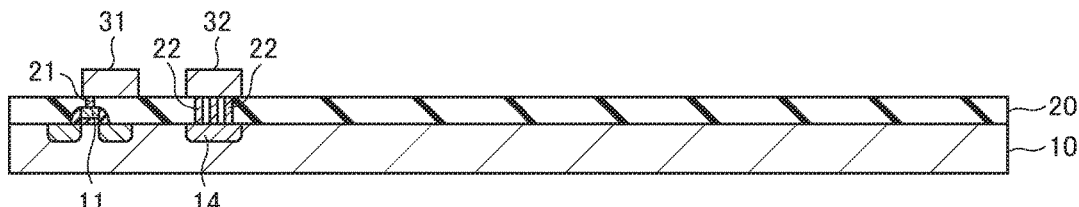
FIG. 4 is a cross-sectional view, at the third step, of the semiconductor device according to one embodiment of the invention.

In a third step, as shown in FIG. 3, a metal layer 30 is formed on the interlayer insulating film 20. The metal layer 30 includes aluminum (Al), for example. Furthermore, a photoresist is provided on the metal layer 30 using a photolithography method, the metal layer 30 is etched using the photoresist as a mask, and thereby metal interconnects 31 and 32 are formed on the interlayer insulating film 20, as shown in FIG. 4. The metal interconnect 31 is electrically connected to the gate electrode 11 via the plug 21, and the metal interconnect 32 is electrically connected to the contact region 14 of the semiconductor substrate 10 via the plugs 22.

Figure 5:
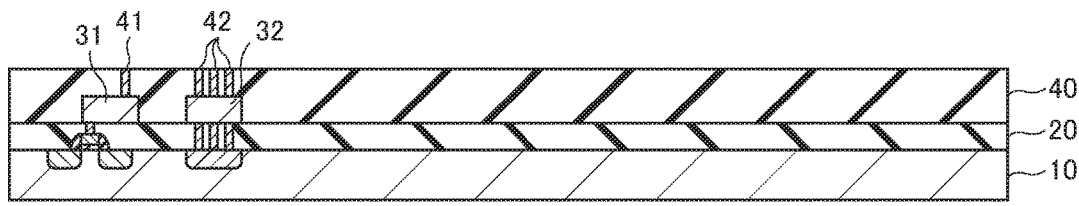
FIG. 5 is a cross-sectional view, at a fourth step, of the semiconductor device according to one embodiment of the invention.

In a fourth step, as shown in FIG. 5, an interlayer insulating film 40 is formed on the interlayer insulating film 20 on which the metal interconnects 31 and 32 are provided. Furthermore, a photoresist is provided on the interlayer insulating film 40 using a photolithography method, the interlayer insulating film 40 is etched using the photoresist as a mask, and thereby through holes are provided in the interlayer insulating film 40.

The through holes of the interlayer insulating film 40 are filled with metal such as tungsten (W), and plugs 41 and 42 are formed. Thereafter, an upper surface of the interlayer insulating film 40 is polished by CMP or the like, and thereby excess metal film formed on the interlayer insulating film 40 is removed. The through holes in the interlayer insulating film 40 reach the metal interconnects 31 and 32, and the plugs 41 and 42 formed in the through hole are respectively electrically connected to the metal interconnects 31 and 32.

Figure 6:
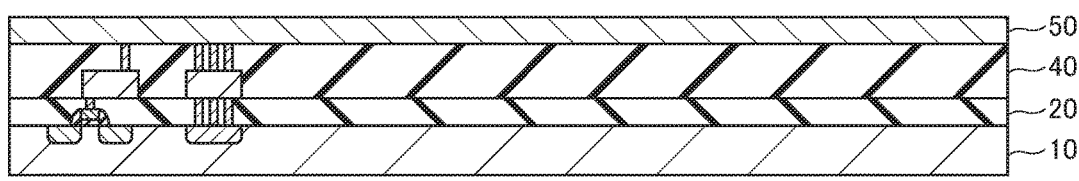
FIG. 6 is a cross-sectional view, at a fifth step, of the semiconductor device according to one embodiment of the invention.
Figure 7:
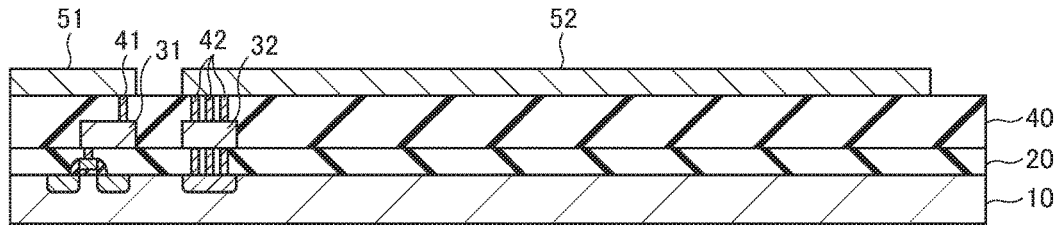
FIG. 7 is a cross-sectional view, at the fifth step, of the semiconductor device according to one embodiment of the invention.

In a fifth step, as shown in FIG. 6, a metal layer 50 is formed on the interlayer insulating film 40. The metal layer 50 includes aluminum (Al), for example, and corresponds to a first metal layer that constitutes a pad having a multilayer structure. Furthermore, a photoresist is provided on the metal layer 50 using a photolithography method, the metal layer 50 is etched using the photoresist as a mask, and as a result, a metal interconnect 51 is formed on the interlayer insulating film 40, as shown in FIG. 7. At the same time, a first pad 52 constituted by the first metal layer is formed on the interlayer insulating film 40. The metal interconnect 51 is electrically connected to the metal interconnect 31 via the plug 41, and the first pad 52 is electrically connected to the metal interconnect 32 via the plugs 42.

Figure 8:
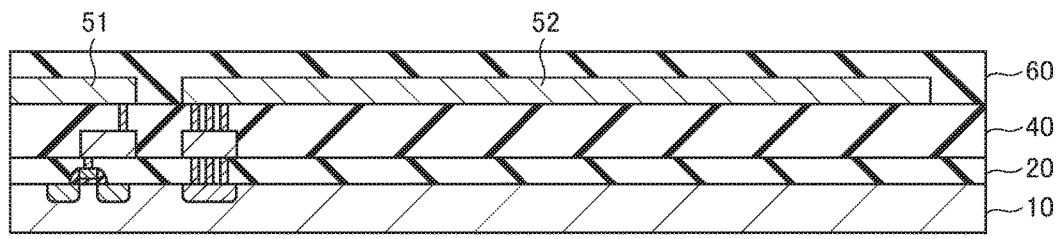
FIG. 8 is a cross-sectional view, at a sixth step, of the semiconductor device according to one embodiment of the invention.
Figure 9:
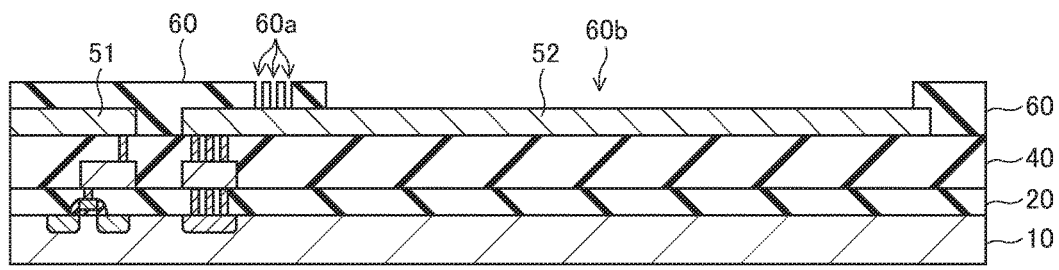
FIG. 9 is a cross-sectional view, at a seventh step, of the semiconductor device according to one embodiment of the invention.

In a sixth step, as shown in FIG. 8, an interlayer insulating film 60 serving as an insulating layer is formed on the interlayer insulating film 40 on which the metal interconnect 51 and the first pad 52 are provided. Furthermore, in a seventh step, a photoresist is provided on the interlayer insulating film 60 using a photolithography method, the interlayer insulating film 60 is etched using the photoresist as a mask, and as a result, through holes 60a are provided in the interlayer insulating film 60, as shown in FIG. 9. At the same time, a portion, of the interlayer insulating film 60, that is on at least a partial region of the first pad 52 is removed, and as a result, an opening portion 60b is provided in the interlayer insulating film 60. The through holes 60a have an opening diameter that is smaller than the opening diameter of the opening portion 60b.

Figure 10:
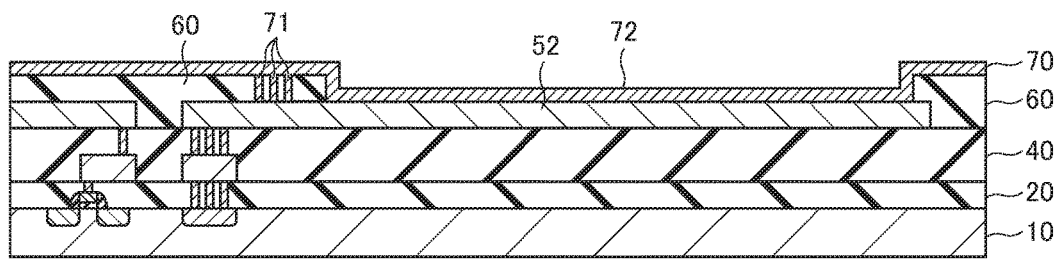
FIG. 10 is a cross-sectional view, at an eighth step, of the semiconductor device according to one embodiment of the invention.

In an eighth step, as shown in FIG. 10, a metal film 70 is formed on the first pad 52 and the interlayer insulating film 60. The metal film 70 includes tungsten (W), for example, and corresponds to a second metal layer that constitutes the pad having a multilayer structure. Accordingly, the through holes 60a in the interlayer insulating film 60 are filled with metal including tungsten (W), and plugs 71 are formed. At the same time, a second pad 72 constituted by the second metal layer is formed on the first pad 52 in the opening portion 60b of the interlayer insulating film 60.

The second pad 72 is formed to have a film thickness that is smaller than the film thickness (thickness of the plugs 71) of the adjacent interlayer insulating film 60 in a portion other than the portion that forms side walls of the interlayer insulating film 60. Accordingly, because the central portion of the second pad 72 need not be thinned through polishing, dishing (excess polishing in the central portion) is prevented from occurring in the polishing process, and the concentration of stress on the central portion is mitigated, and as a result, the occurrence of a crack in the pad can be suppressed.

In general, when a large plate such as a pad is polished by CMP, dishing occurs. In the case where a central portion of the pad is depressed by dishing, stress concentrates on the central portion of the pad in the wire bonding process. Therefore, if the central portion of the pad need not be polished, because dishing does not occur, the mechanical strength of the pad can be improved more than before, and the occurrence of a crack can be suppressed.

On the other hand, in the through holes 60a in the interlayer insulating film 60, the metal film 70 may be formed to have a film thickness that is larger than the film thickness of the adjacent interlayer insulating film 60. Accordingly, at the same time the plug 71 is formed by filling the through holes 60a with a sufficient amount of metal, the second pad 72 can be formed in the opening portion 60b.

Figure 11:
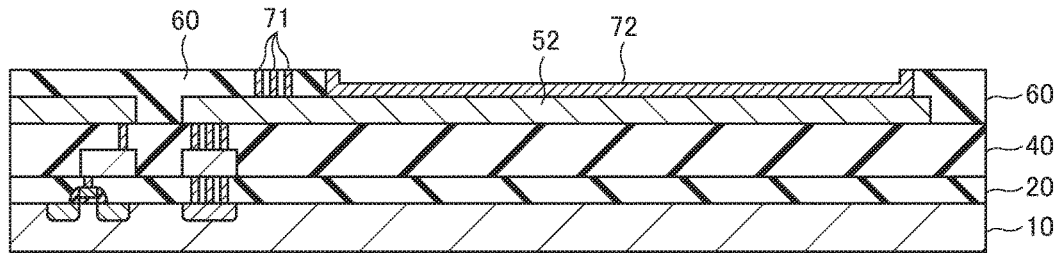
FIG. 11 is a cross-sectional view, at the eighth step, of the semiconductor device according to one embodiment of the invention.

Thereafter, as shown in FIG. 11, the upper surface of the interlayer insulating film 60 is polished by CMP or the like, and as a result, excess metal film formed on the interlayer insulating film 60 is removed. Accordingly, the upper surface of the interlayer insulating film 60 can be planarized such that the plugs 71 do not protrude from the through holes 60a. The plugs 71 and the second pad 72 are electrically connected to the first pad 52.

Figure 12:
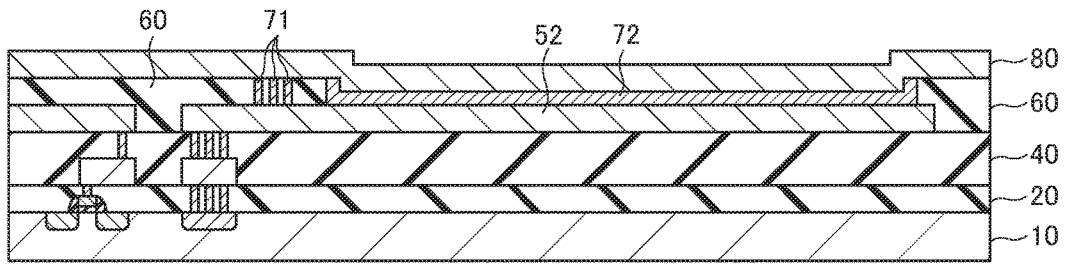
FIG. 12 is a cross-sectional view, at a ninth step, of the semiconductor device according to one embodiment of the invention.
Figure 13:
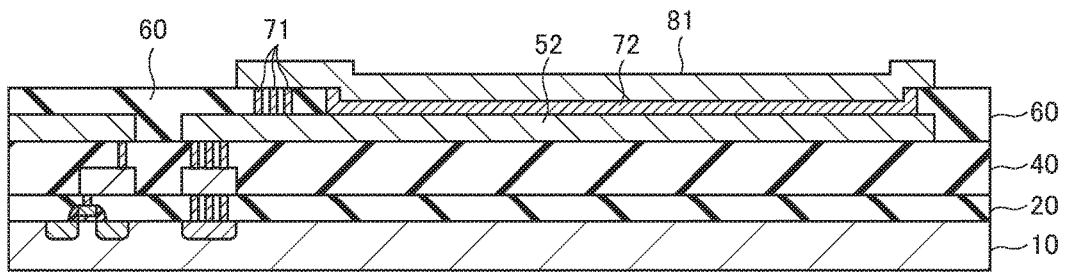
FIG. 13 is a cross-sectional view, at the ninth step, of the semiconductor device according to one embodiment of the invention.

In a ninth step, as shown in FIG. 12, a metal layer 80 is formed on the interlayer insulating film 60 and the second pad 72. The metal layer 80 includes aluminum (Al), for example, and corresponds to a third metal layer of the pad having a multilayer structure. Furthermore, a photoresist is provided on the metal layer 80 using a photolithography method, the metal layer 80 is etched using the photoresist as a mask, and as a result, a third pad 81 constituted by the third metal layer is formed on the interlayer insulating film 60 and the second pad 72, as shown in FIG. 13. The third pad 81 is electrically connected to the first pad 52 via the plugs 71 and the second pad 72.

Figure 14:
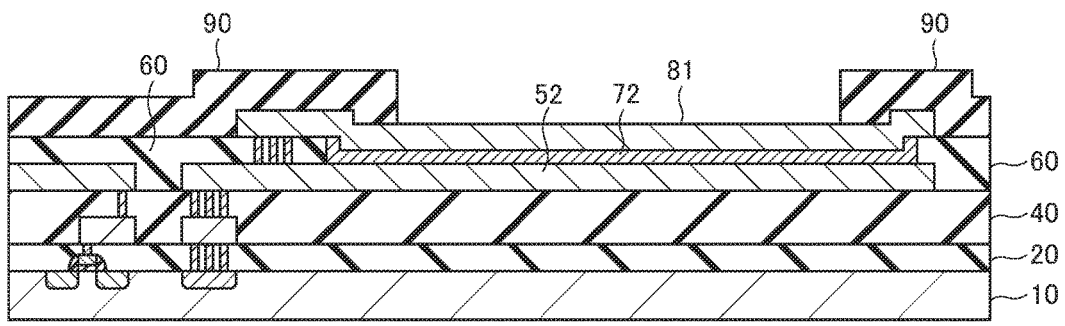
FIG. 14 is a cross-sectional view, at a tenth step, of the semiconductor device according to one embodiment of the invention.

In a tenth step, as shown in FIG. 14, a passivation film (protective film) 90 that covers a peripheral portion of the third pad 81 in plan view is formed on the interlayer insulating film 60 and the third pad 81 using a photolithography method. Note that, in the present application, "in plan view" refers to viewing portions in a direction vertical to the principal surface (upper surface in the diagram) of the semiconductor substrate 10 in a see-through manner. The passivation film 90 is constituted by an insulating film made of silicon nitride (Si$_3$N$_4$), silicon oxide (SiO$_2$), magnesium oxide (MgO), or the like, for example.

Figure 15:
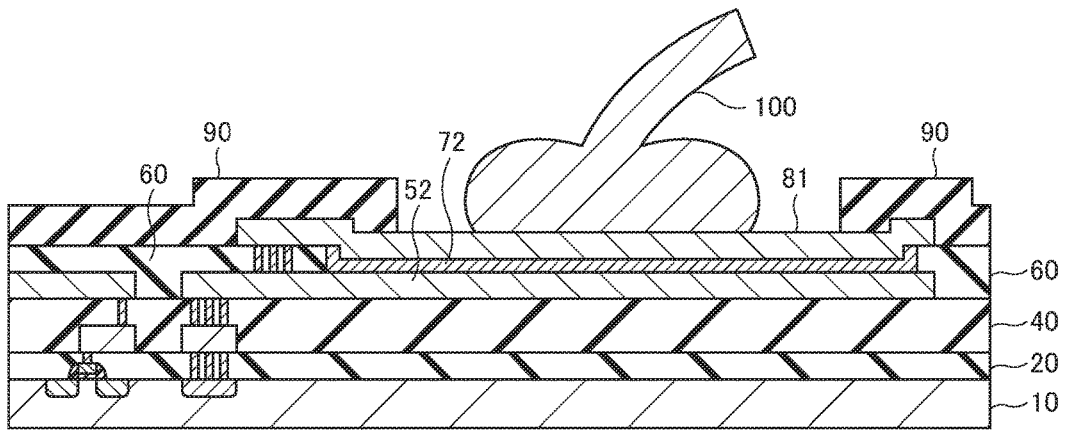
FIG. 15 is a cross-sectional view, at an eleventh step, of the semiconductor device according to one embodiment of the invention.

Furthermore, in an eleventh step, as shown in FIG. 15, one end of a wire 100 may be bonded to the third pad 81. Accordingly, the pad of a semiconductor chip can be electrically connected to a terminal or an electrode of a semiconductor package, a printed circuit board, or the like. In the present application, the region, of the principal surface (upper surface in the diagram) of the third pad 81, that is not covered by the passivation film 90 is also referred to as "bonding region". For example, after the metal of the tip of the wire 100 is melted by discharge such that the tip has a ball-like shape, the tip of the wire 100 is connected to the bonding region of the third pad 81 by using heat, ultrasonic waves, or pressure.

A copper (Cu) wire, a gold (Au) wire, or the like is used in the wire bonding process. Specifically, the copper wire has higher hardness compared with the gold wire and the aluminum pad, and there are cases where a pad does not have a strength that is sufficient to endure mechanical stress when the wire is bonded, and therefore, a crack occurs in the pad or an interlayer insulating film.

According to the present embodiment, a pad having a multilayer structure is constituted by a plurality of metal plates including the first pad 52, the second pad 72, and the third pad 81, and as a result, the mechanical strength of the pad is improved more than before, and the occurrence of a crack can be suppressed. Also, the second pad 72 is formed to have a film thickness that is smaller than the film thickness of the interlayer insulating film 60, and as a result, the second pad 72 need not be thinned through polishing. Furthermore, the first pad 52 and the second pad 72 are formed at the same time the metal interconnect 51 and the plugs 71 are formed, and as a result, the semiconductor device according to the present embodiment can be manufactured without adding new steps to a common manufacturing method of a semiconductor device.

Semiconductor Device

Figure 16:
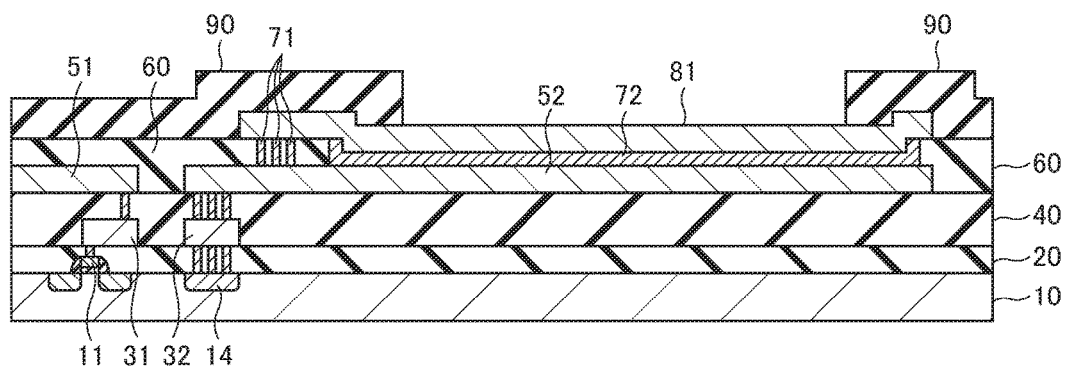
FIG. 16 is a cross-sectional view of the semiconductor device according to one embodiment of the invention.
Figure 17:
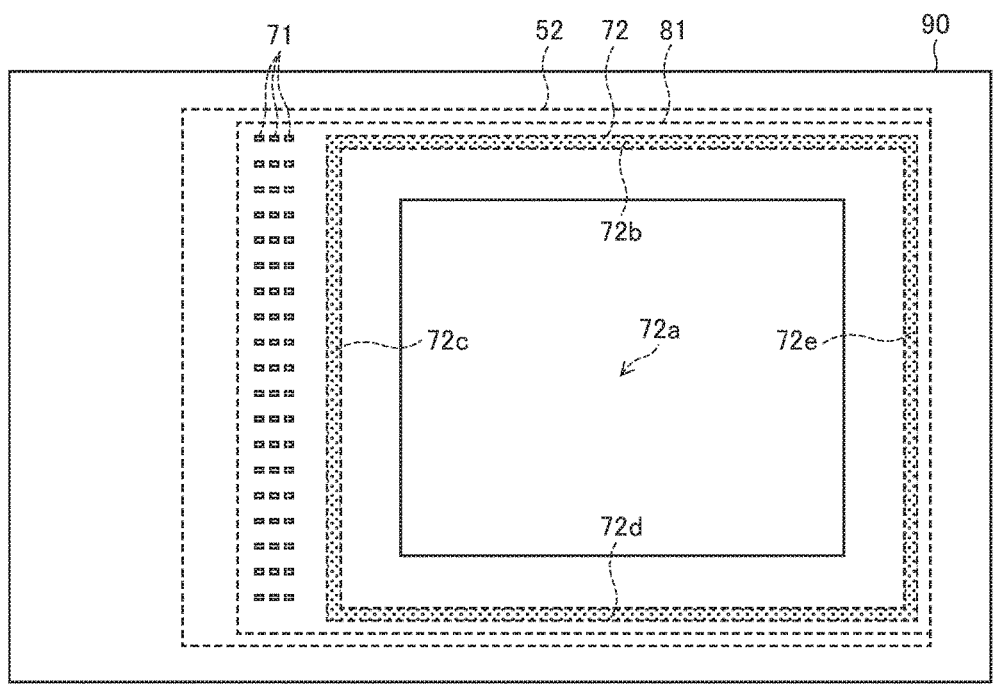
FIG. 17 is a plan view of the semiconductor device according to one embodiment of the invention.

FIG. 16 is a cross-sectional view of the semiconductor device according to one embodiment of the invention, and FIG. 17 is a plan view of the semiconductor device according to one embodiment of the invention. As shown in FIGS. 16 and 17, the semiconductor device according to one embodiment of the invention includes the semiconductor substrate 10, the interlayer insulating film 20, the metal interconnects 31 and 32, the interlayer insulating film 40, the metal interconnect 51 and the first pad 52, the interlayer insulating film 60, the second pad 72, the third pad 81, and the passivation film 90.

As shown in FIG. 16, an N-channel MOS transistor having the gate electrode 11 and the contact region 14 are arranged in the P-type semiconductor substrate 10, for example. The interlayer insulating film 20 is arranged on the semiconductor substrate 10, and the metal interconnects 31 and 32 and the interlayer insulating film 40 are arranged on the interlayer insulating film 20. The metal interconnect 31 is electrically connected to the gate electrode 11 via the plug arranged in the through hole in the interlayer insulating film 20. The metal interconnect 32 is electrically connected to the contact region 14 of the semiconductor substrate 10 via the plugs arranged in the contact holes in the interlayer insulating film 20.

The metal interconnect 51, the first pad 52 constituted by the first metal layer, and the interlayer insulating film 60 are arranged on the interlayer insulating film 40. The metal interconnect 51 is electrically connected to the metal interconnect 31 via the plug arranged in the through hole in the interlayer insulating film 40. In this example, the metal interconnect 51 is electrically connected to the gate electrode 11 of the N-channel MOS transistor, and is used to supply a signal to the gate electrode 11. The first pad 52 is electrically connected to the metal interconnect 32 via the plugs arranged in the through holes in the interlayer insulating film 40.

The interlayer insulating film 60, which is an insulating layer that has the through holes 60a (FIG. 9) and the opening portion 60b (FIG. 9), is arranged on the first pad 52. The through holes 60a have an opening diameter that is smaller than the opening diameter of the opening portion 60b. The second pad 72 constituted by the second metal layer is arranged in the opening portion 60b of the interlayer insulating film 60. Also, the third pad 81 constituted by the third metal layer is arranged on the interlayer insulating film 60 and the second pad 72. Furthermore, one end of the wire 100 (FIG. 15) may be bonded to the third pad 81.

As shown in FIGS. 16 and 17, the first pad 52, the second pad 72, and the third pad 81 are stacked to configure the pad having a multilayer structure. In this example, the pad having a multilayer structure is electrically connected to the contact region 14 of the semiconductor substrate 10, and is used to apply a potential to the semiconductor substrate 10. According to the present embodiment, as a result of configuring a pad having a multilayer structure with the plurality of metal plates including the first pad 52, the second pad 72, and the third pad 81, the mechanical strength of the pad can be improved more than before, and the occurrence of a crack can be suppressed.

Also, the semiconductor device may further include the plugs 71 arranged in the through holes 60a in the interlayer insulating film 60. The plugs 71 are electrically connected to the first pad 52 and the third pad 81. Accordingly, the electrical connection between the first pad 52 and the third pad 81 can be enhanced.

The passivation film 90 covers the peripheral portion of the third pad 81 in plan view. Here, the second pad 72 desirably has a uniform (approximately constant) film thickness under the region (bonding region), of the third pad 81, that is not covered by the passivation film 90. Accordingly, the concentration of stress on the central portion that occurs when the central portion of the second pad 72 is thinner than the peripheral portion is mitigated, and the occurrence of a crack in the pad can be suppressed.

The second pad 72 has a film thickness that is smaller than the film thickness (thickness of the plugs 71) of the adjacent interlayer insulating film 60 in a portion other than the portion that forms a side walls of the interlayer insulating film 60. For example, the second pad 72 has a box shape that is constituted by a bottom portion 72a arranged along the first pad 52 and four side walls 72b to 72e that are arranged along four side surfaces of the opening portion 60b (FIG. 9) of the interlayer insulating film 60. The film thickness of the bottom portion 72a of the second pad 72 is smaller than the film thickness of the interlayer insulating film 60, and therefore, the resistance value of the second pad 72 between the first pad 52 and the third pad 81 can be reduced, or the manufacturing cost of the second pad 72 can be reduced.

In that described above, the first pad 52 may have a film thickness of 1.5 µm or less. In the case of using a pad having a multilayer structure, even if the film thickness of each layer of the pad is reduced in order to achieve high integration of the semiconductor device, the mechanical strength of the pad can be improved, and the occurrence of a crack can be suppressed. Also, the plugs 71 arranged in the interlayer insulating film 60 may have a thickness of 1.5 µm or less, the second pad 72 may have a film thickness of 1.5 µm or less, or the third pad 81 may have a film thickness of 1.5 µm or less.

Furthermore, the second pad 72 may have a Young's modulus that is larger than the Young's modulus of each of the first pad 52 and the third pad 81. For example, the first pad 52 and the third pad 81 each include aluminum (Al), and are made of aluminum (Al) or an aluminum alloy (such as Al—Cu). Also, the second pad 72 includes tungsten (W), and is made of tungsten (W), a tungsten silicide (WSi), which is a compound of tungsten and silicon, or the like.

Here, the Young's modulus of aluminum (Al) is approximately 70 GPa. Also, the Young's modulus of tungsten (W) is approximately 410 GPa, and the Young's modulus of the tungsten silicide (WSi) is approximately 403 GPa. Note that the Young's modulus of a silicon oxide ($SiO_2$) is approximately 70 GPa.

As a result of configuring the pad having a multilayer structure with the first pad 52, the second pad 72, and the third pad 81 having the Young's moduluses described above, a force applied to a partial region of the third pad 81 is applied to the interlayer insulating film 40 via the first pad 52 after being distributed along the principal surface of the second pad 72, and as a result, the occurrence of a crack in the interlayer insulating film 40 can be suppressed.

Alternatively, the first pad 52 may be arranged on an interlayer insulating film 40 including FSG (silicate glass doped with fluorine in order to reduce relative permittivity) or a low-k material. The low-k material is an interlayer insulating film material whose relative permittivity is less than that of silicon oxide ($SiO_2$), and has a relative permittivity (k) of 3.0 or less, for example.

Specifically, a PE-CVD (Plasma Enhanced-Chemical Vapor Deposition) carbon-added silicon oxide film (SiOC film) or a film of porous silica whose relative permittivity is reduced by introducing vacancies into silicon oxide ($SiO_2$) can be used as the interlayer insulating film 40.

By using such an interlayer insulating film 40, although the parasitic capacitance of the pad can be reduced, the mechanical strength of the interlayer insulating film 40 decreases. However, in the case of using the pad having a multilayer structure, even if the mechanical strength of the interlayer insulating film 40 is low, the mechanical strength of the pad can be improved, and the occurrence of a crack can be suppressed.

The entire disclosure of Japanese Patent Application No. 2016-119828, filed Jun. 16, 2016 is expressly incorporated by reference herein.

What is claimed is:

1. A semiconductor device comprising:
    a first pad constituted by a first metal layer;
    an insulating layer that is arranged on the first pad, and includes an opening portion;
    a second pad that is arranged in the opening portion of the insulating layer, has a film thickness that is smaller than a film thickness of the insulating layer, and is constituted by a second metal layer; and
    a third pad that is arranged on the second pad, and is constituted by a third metal layer,
    wherein the second pad directly contacts a top surface of the first pad,
    wherein the insulating layer further includes a plurality of through holes each having an opening diameter that is smaller than an opening diameter of the opening portion,
    wherein the semiconductor device further includes a plurality of plugs, a plug of the plurality of plugs arranged in each through hole in the insulating layer and directly physically contacts the first and third pads but not the second pad,
    wherein the first pad has a film thickness of 1.5 µm or less, and
    wherein the plurality of plugs is a first plurality of plugs, and a second plurality of plugs are provided so as to contact the first pad on a surface opposite the surface of the first pad that contacts the first plurality of plugs, and the second plurality of plugs are provided in a position that does not overlap the third pad and the second pad.

2. The semiconductor device according to claim 1, further comprising a protective film that covers a peripheral portion of the third pad in plan view,
    wherein the second pad has a uniform film thickness under a region, of the third pad, that is not covered by the protective film.

3. The semiconductor device according to claim 2, wherein the second pad has a box shape that includes a bottom portion that is arranged along the first pad, and four walls that are arranged along the opening portion of the insulating layer.

4. The semiconductor device according to claim 2, wherein the second pad has a Young's modulus that is larger than the Young's modulus of each of the first and third pads.

5. The semiconductor device according to claim 2, wherein the first and third pads include aluminum, and the second pad includes tungsten.

6. The semiconductor device according to claim 1, wherein the second pad has a box shape that is constituted by a bottom portion that is arranged along the first pad and four side walls that are arranged along four side surfaces of the opening portion of the insulating layer.

7. The semiconductor device according to claim 6, wherein the second pad has a Young's modulus that is larger than the Young's modulus of each of the first and third pads.

8. The semiconductor device according to claim 6, wherein the first and third pads include aluminum, and the second pad includes tungsten.

9. The semiconductor device according to claim 1, wherein the second pad has a Young's modulus that is larger than the Young's modulus of each of the first and third pads.

10. The semiconductor device according to claim 9, wherein the first and third pads include aluminum, and the second pad includes tungsten.

11. The semiconductor device according to claim 1, wherein the first and third pads each include aluminum, and the second pad includes tungsten.

12. The semiconductor device according to claim 11, wherein the first and third pads include aluminum, and the second pad includes tungsten.

13. The semiconductor device according to claim 1, wherein the first pad is arranged on an interlayer insulating film that includes FSG (fluorine-doped silicate glass) or a low-k material.

14. The semiconductor device according to claim 13, wherein the first and third pads include aluminum, and the second pad includes tungsten.

15. The semiconductor device according to claim 1, wherein the third pad bonds to one end of a copper wire.

* * * * *